US011894783B2

United States Patent
Sakai

(10) Patent No.: US 11,894,783 B2
(45) Date of Patent: Feb. 6, 2024

(54) SEMICONDUCTOR DEVICE

(71) Applicant: Mitsubishi Electric Corporation, Tokyo (JP)

(72) Inventor: Shinji Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/232,262

(22) Filed: Apr. 16, 2021

(65) Prior Publication Data

US 2022/0109380 A1 Apr. 7, 2022

(30) Foreign Application Priority Data

Oct. 1, 2020 (JP) .................................. 2020-167185

(51) Int. Cl.
*H02M 7/53* (2006.01)
*H02M 7/537* (2006.01)
*H03K 17/567* (2006.01)
*H02M 1/08* (2006.01)
*H02M 1/088* (2006.01)

(52) U.S. Cl.
CPC ............ *H02M 7/537* (2013.01); *H02M 1/08* (2013.01); *H02M 1/088* (2013.01); *H03K 17/567* (2013.01)

(58) Field of Classification Search
CPC .... H02M 1/00; H02M 1/0006; H02M 1/0045; H02M 1/08; H02M 1/088; H02M 7/00; H02M 7/537; H02M 7/5387; H03K 17/00; H03K 17/127; H03K 17/567
USPC ....................................................... 363/132
See application file for complete search history.

(56) References Cited

U.S. PATENT DOCUMENTS 5,646,548 A * 7/1997 Yao ................. H03K 19/018521
326/80
10,110,219 B2 * 10/2018 Kakimoto ............ H03K 17/567
2014/0029323 A1 1/2014 Makita et al.
(Continued)

FOREIGN PATENT DOCUMENTS

JP 2014-027831 A 2/2014
JP 2017-28779 A 2/2017
(Continued)

OTHER PUBLICATIONS

An Office Action issued by the German Patent and Trade Mark Office dated Dec. 6, 2022, which corresponds to German Patent Application No. 102021113259.2 and is related to U.S. Appl. No. 17/232,262; with English language translation.
(Continued)

*Primary Examiner* — Daniel C Puentes
(74) *Attorney, Agent, or Firm* — Studebaker & Brackett PC

(57) ABSTRACT

A semiconductor device includes: first and second power transistors connected in parallel with each other and having different saturated currents; and a gate driver driving the first and second power transistors with individual gate voltages, respectively, the gate driver includes a drive circuit receiving an input signal and outputting a drive signal, a first amplifier amplifying the drive signal in accordance with first power voltage and supplying the amplified drive signal to a gate of the first power transistor, and a second amplifier amplifying the drive signal in accordance with second power voltage different from the first power voltage and supplying the amplified drive signal to a gate of the second power transistor.

12 Claims, 5 Drawing Sheets

(56) References Cited

U.S. PATENT DOCUMENTS

| | | | |
|---|---|---|---|
| 2017/0019097 A1* | 1/2017 | Sato | H03K 17/567 |
| 2017/0302152 A1 | 10/2017 | Watanabe et al. | |
| 2018/0062533 A1 | 3/2018 | Maruyama | |
| 2018/0151708 A1* | 5/2018 | Toshiyuki | H03K 17/0828 |
| 2019/0386652 A1* | 12/2019 | Korner | H03K 17/122 |
| 2020/0028496 A1* | 1/2020 | Tokumasu | H03K 17/567 |
| 2021/0258004 A1 | 8/2021 | Akiyama et al. | |

FOREIGN PATENT DOCUMENTS

| | | |
|---|---|---|
| JP | 2018-038216 A | 3/2018 |
| JP | 2018-068097 A | 4/2018 |
| JP | 2020-18037 A | 1/2020 |
| JP | 2020-061903 A | 4/2020 |

OTHER PUBLICATIONS

An Office Action; "Notice of Reasons for Refusal," mailed by the Japanese Patent Office dated Aug. 15, 2023, which corresponds to Japanese Patent Application No. 2020-167185 and is related to U.S. Appl. No. 17/232,262; with English language translation.

An Office Action; "Decision of Refusal," mailed by the Japanese Patent Office dated Dec. 5, 2023, which corresponds to Japanese Patent Application No. 2020-167185 and is related to U.S. Appl. No. 17/232,262; with English language translation.

\* cited by examiner

US 11,894,783 B2

SEMICONDUCTOR DEVICE

BACKGROUND OF THE INVENTION

Field

The present disclosure relates to a semiconductor device in which power transistors are driven in parallel.

Background

In a semiconductor device in which power transistors are driven in parallel, a MOSFET (unipolar) and an IGBT (bipolar) are combined as the power transistors for characteristic improvement. When common gate voltage is used for driving these power transistors, the gate voltage is restricted by short-circuit tolerance of the IGBT, and thus characteristic improvement due to increase of the gate voltage of the MOSFET is limited. This prevents chip size shrink of the MOSFET, and cost reduction and size reduction cannot be achieved. Thus, a semiconductor device in which two power transistors are controlled by separate drive circuits having power voltages different from each other has been disclosed (see, for example, Japanese Patent Laid-Open No. 2020-18037).

SUMMARY

However, since separate drive circuits need to be prepared, the number of components and circuit scale increase and total cost reduction cannot be achieved. In addition, variation of transfer delay occurs between two drive circuits having power voltages different from each other, and accordingly, quality and performance decrease.

The present disclosure is intended solve the above-described problem and provide a semiconductor device that can achieve cost reduction and improve quality and performance.

A semiconductor device according to the present disclosure includes: first and second power transistors connected in parallel with each other and having different saturated currents; and a gate driver driving the first and second power transistors with individual gate voltages, respectively, the gate driver includes a drive circuit receiving an input signal and outputting a drive signal, a first amplifier amplifying the drive signal in accordance with first power voltage and supplying the amplified drive signal to a gate of the first power transistor, and a second amplifier amplifying the drive signal in accordance with second power voltage different from the first power voltage and supplying the amplified drive signal to a gate of the second power transistor.

In the present disclosure, the drive circuit is common to the first and second power transistors. Accordingly, circuit scale and cost can be reduced as compared to a case in which drive circuits are individually provided to the first and second power transistors. Moreover, since the drive circuit is common and a drive signal is bifurcated right before outputting, variation of transfer delay can be reduced. Accordingly, quality and performance can be improved.

Other and further objects, features and advantages of the invention will appear more fully from the following description.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figure 1:
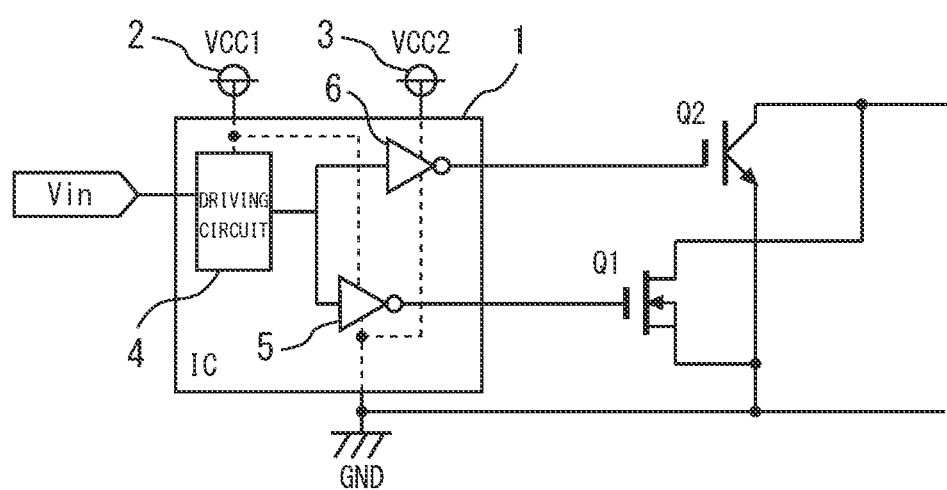
FIG. 1 is a circuit diagram illustrating a semiconductor device according to a first embodiment.

FIG. 1 is a circuit diagram illustrating a semiconductor device according to a first embodiment. A first power transistor Q1 is a MOSFET, and a second power transistor Q2 is a bipolar transistor such as an IGBT. The first and second power transistors Q1 and Q2 have different gm characteristics and saturated currents. The first and second power transistors Q1 and Q2 are connected in parallel with each other.

A gate driver 1 is an IC configured to drive the first and second power transistors Q1 and Q2 with individual gate voltages, respectively. External power sources 2 and 3 are provided outside the gate driver 1 and supply first and second power voltages VCC1 and VCC2, respectively, to the gate driver 1. The second power voltage VCC2 is different from the first power voltage VCC1.

The gate driver 1 includes a drive circuit 4, a first amplifier 5, and a second amplifier 6. The drive circuit 4 receives an input signal Vin and performs processing such as level shift on the input signal Vin and outputs a drive signal. The drive signal output from the drive circuit 4 is bifurcated into two signals, and the two signals are input to the first and second amplifiers 5 and 6, respectively. The first amplifier 5 amplifies the drive signal in accordance with the first power voltage VCC1 and supplies the amplified drive signal to the gate of the first power transistor Q1. The second amplifier 6 amplifies the drive signal in accordance with the second power voltage VCC2 and supplies the amplified drive signal to the gate of the second power transistor Q2. Accordingly, the gate voltages of the first and second power transistors Q1 and Q2 can be set to values different from each other not only in transient operation environment but also in static operation environment.

Figure 2:
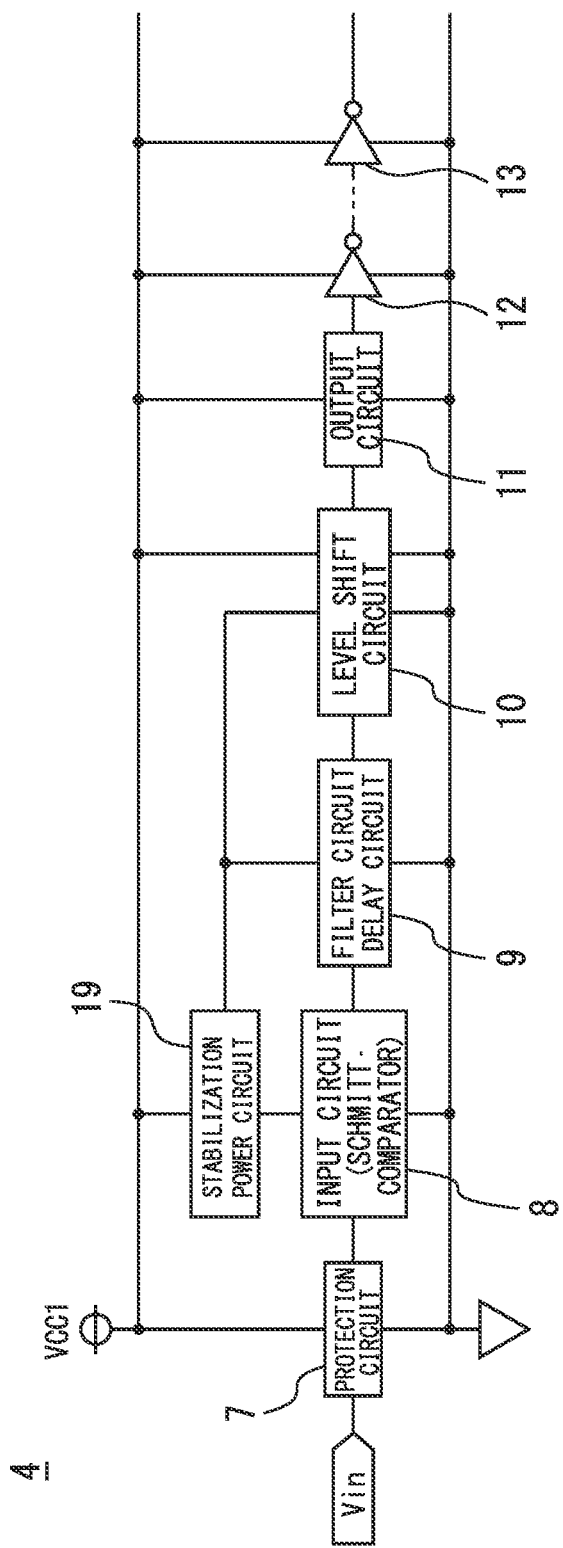
FIG. 2 is a circuit diagram illustrating the drive circuit.

FIG. 2 is a circuit diagram illustrating the drive circuit. The input signal Vin is input to an input circuit 8 through a protection circuit 7. The input circuit 8 is a Schmitt comparator. An output signal from the input circuit 8 is filtered and delayed by a filter circuit/delay circuit 9 and then level-shifted by a level shift circuit 10. A stabilization power circuit 19 supplies electrical power to the input circuit 8, the filter circuit/delay circuit 9, and the level shift circuit 10. An output signal from the level shift circuit 10 is output as a drive signal through an output circuit 11 and inverters 12 and 13.

In the present embodiment, the drive circuit 4 is common to the first and second power transistors Q1 and Q2. Accordingly, circuit scale and cost can be reduced as compared to a case in which drive circuits are individually provided to the first and second power transistors Q1 and Q2. Moreover, since the drive circuit 4 is common and a drive signal is bifurcated right before outputting, variation of transfer delay can be reduced. Accordingly, quality and performance can be improved.

The first and second power voltages VCC1 and VCC2 are supplied from the individual external power sources 2 and 3 to the first and second amplifiers 5 and 6, respectively. The saturated current of the first power transistor Q1 is smaller than the saturated current of the second power transistor Q2, and thus the second power voltage VCC2 is set to be lower than the first power voltage VCC1. Accordingly, electrical power of the external power source 3 is set to electrical power necessary for gate drive of the second power transistor Q2, and thus circuit scale and cost of the external power source 3 can be reduced.

The first power transistor Q1 is preferably a SiC MOSFET. The SiC MOSFET has high gm characteristics, and performance of the SiC MOSFET can be improved by increasing the gate voltage. In addition, cost can be further reduced by chip shrink or the like.

Second Embodiment

Figure 3:
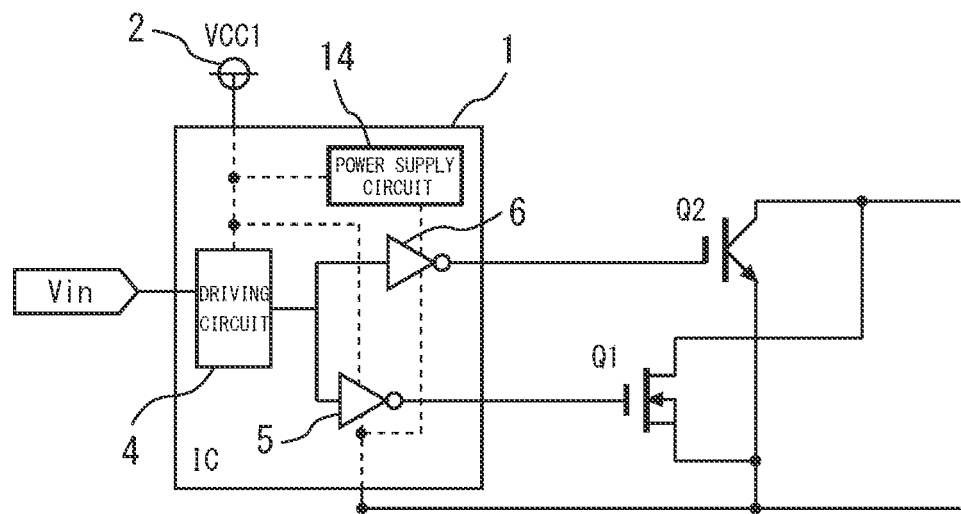
FIG. 3 is a circuit diagram illustrating a semiconductor device according to a second embodiment.

FIG. 3 is a circuit diagram illustrating a semiconductor device according to a second embodiment. In the present embodiment, the gate driver 1 further includes a power circuit 14 configured to generate the second power voltage VCC2 from the first power voltage VCC1 and supply the generated second power voltage VCC2 to the second amplifier 6. The second power voltage VCC2 is lower than the first power voltage VCC1.

Figure 4:
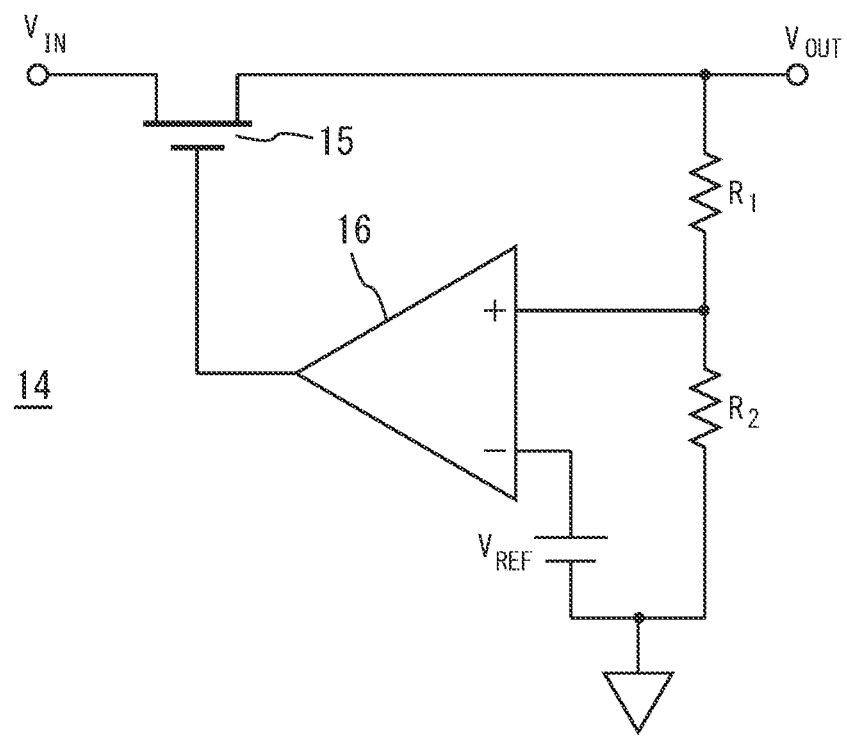
FIG. 4 is a circuit diagram illustrating the power circuit.

FIG. 4 is a circuit diagram illustrating the power circuit. The power circuit 14 is a linear regulator including a transistor 15, a reference voltage source Vref, feedback resistors R1 and R2, and an error amplifier 16. The transistor 15 is a Pch MOSFET, and the source and drain of the transistor 15 are connected with an input terminal VIN and an output terminal $V_{OUT}$, respectively. The voltage of the output terminal $V_{OUT}$ is subjected to resistive division by the feedback resistors R1 and R2 and input to the positive terminal of the error amplifier 16. Reference voltage of the reference voltage source Vref is input to the negative terminal of the error amplifier 16. Output voltage of the error amplifier 16 is supplied to the gate of the transistor 15. The transistor 15 is not limited to a MOSFET but may be a bipolar transistor.

In the present embodiment, the second power voltage VCC2 is generated inside the gate driver 1. Thus, the external power sources can be omitted. Accordingly, the numbers of IC pads and pins can be reduced, and thus circuit scale of the gate driver 1 can be reduced. In addition, cost reduction due to sharing of a common package is possible.

The second power voltage VCC2 is small electrical power necessary only for gate drive of the second power transistor Q2. Accordingly, the second power voltage VCC2 can be generated inside the gate driver 1 by the power circuit 14 having a relatively simplified configuration of resistive division or the like. Thus, increase of circuit scale of the gate driver 1 can be reduced.

Third Embodiment

Figure 5:
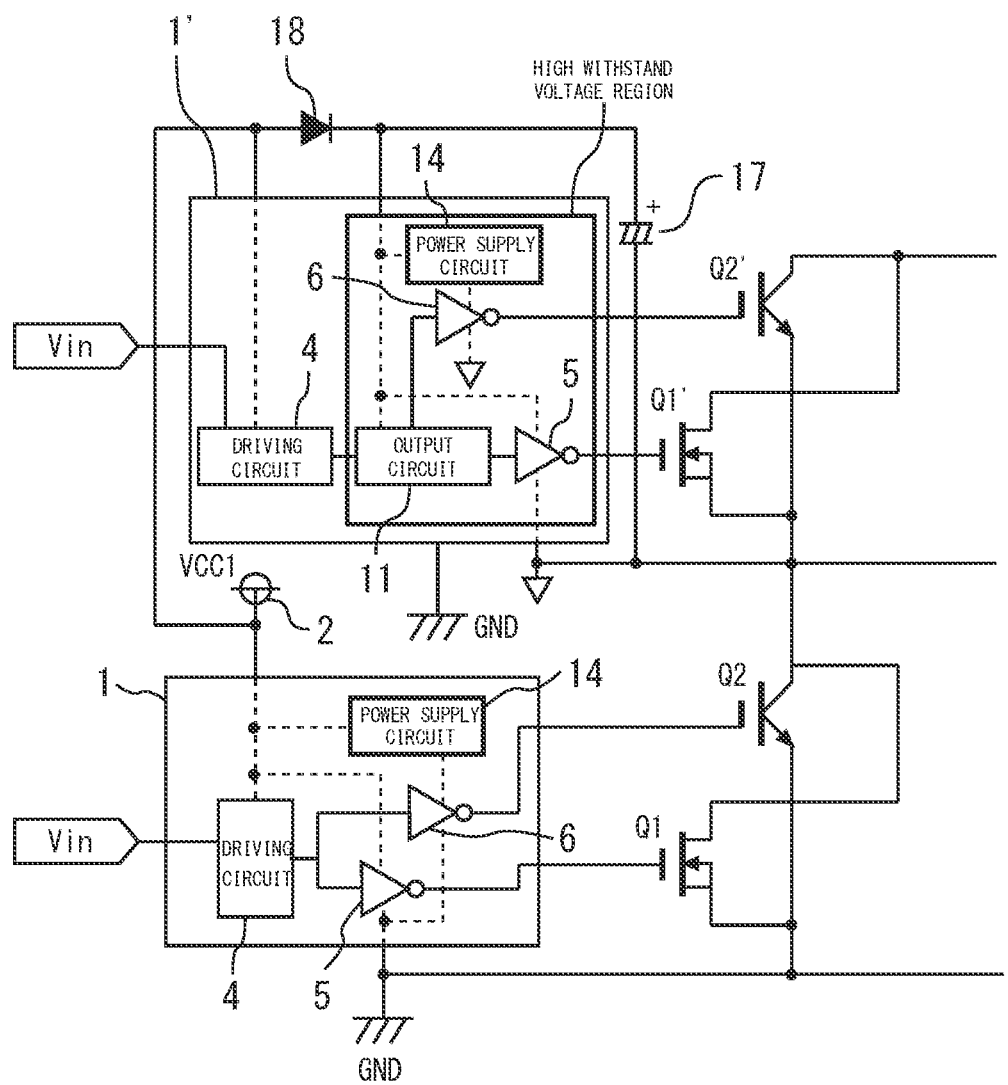
FIG. 5 is a circuit diagram illustrating a semiconductor device according to a third embodiment.

FIG. 5 is a circuit diagram illustrating a semiconductor device according to a third embodiment. First and second power transistors Q1' and Q2' are connected in parallel with each other and connected to the high side of the first and second power transistors Q1 and Q2. The configurations of the first and second power transistors Q1' and Q2' are same as the configurations of the first and second power transistors Q1 and Q2, respectively. A gate driver 1' is an IC configured to drive the first and second power transistors Q1' and Q2' with individual gate voltages, respectively, and has a configuration same as the configuration of the gate driver 1 of the second embodiment. Half-bridge is constituted by the power transistors Q1, Q2, Q1' and Q2' and the gate drivers 1 and 1'.

One power voltage of the gate driver 1' on the high side is supplied from a floating power source that steps up the power voltage VCC1 on the low side. The other power voltage of the gate driver 1' on the high side is generated in a high withstand voltage region of the gate driver 1'. In this example, the floating power source is a bootstrap circuit including a bootstrap capacitor 17 and a bootstrap diode 18. Alternatively, a charging scheme, such as a charge pump scheme, in which power voltage on the low side is used may be employed. Accordingly, it is possible to reduce total cost and the number of components. In addition, effects same as effects of the first and second embodiments can be obtained.

Fourth Embodiment

Figure 6:
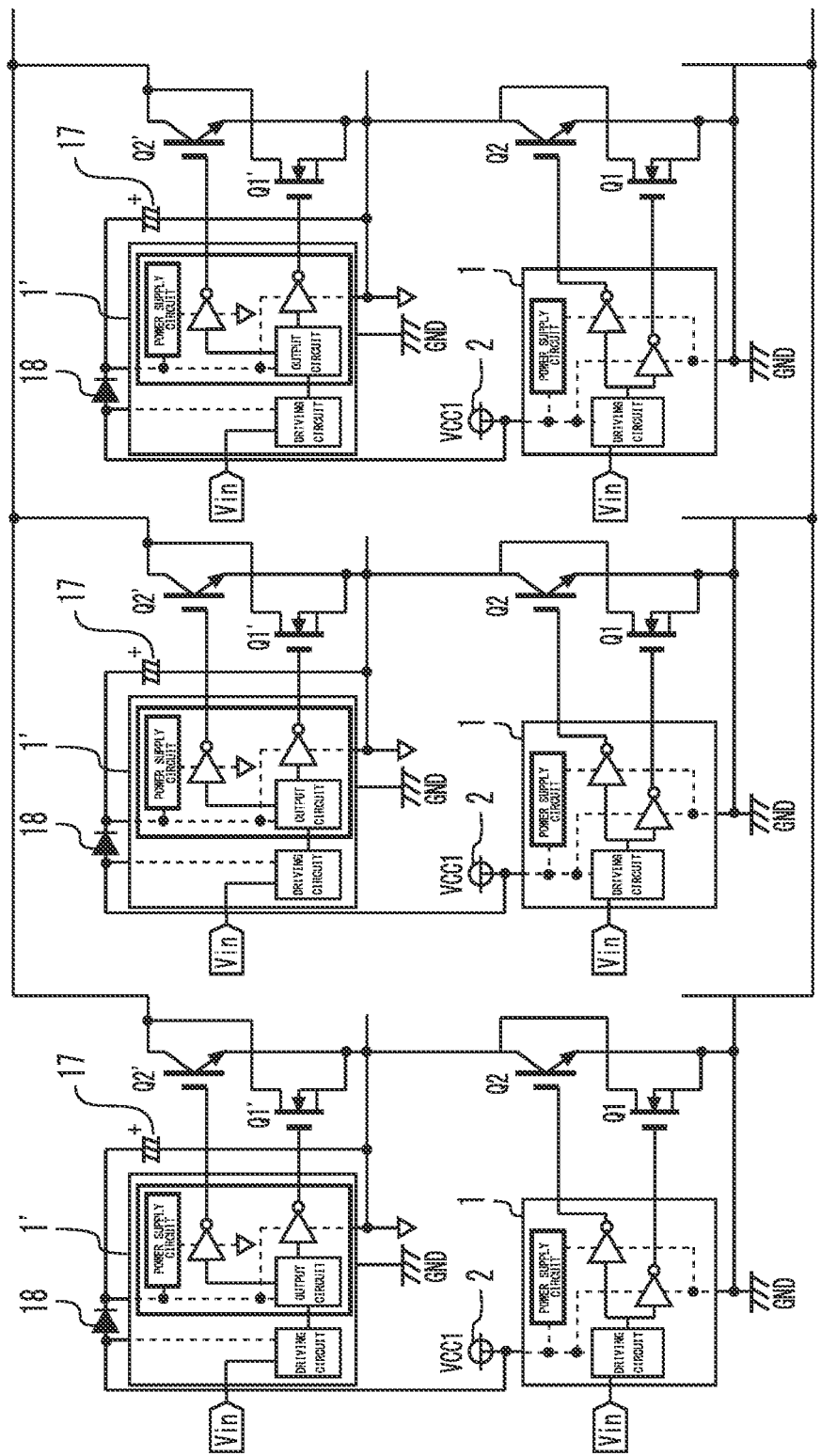
FIG. 6 is a circuit diagram illustrating a semiconductor device according to a fourth embodiment.

FIG. 6 is a circuit diagram illustrating a semiconductor device according to a fourth embodiment. Three half-bridges of the third embodiment are provided to constitute a three-phase inverter. Accordingly, effects same as effects of the first to third embodiments can be obtained for usage in three-phase inverter control.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-167185, filed on Oct. 1, 2020 including specification, claims, drawings and summary, on which the convention priority of the present application is based, is incorporated herein by reference in its entirety.

The invention claimed is:

1. A semiconductor device comprising:
   first and second power transistors connected in parallel with each other and having different saturated currents; and
   a gate driver driving the first and second power transistors with individual gate voltages, respectively,
   the gate driver includes
   a drive circuit receiving an input signal and outputting a drive signal,
   a first amplifier amplifying the drive signal in accordance with first power voltage to supply a first amplified drive signal to a gate of the first power transistor, and
   a second amplifier amplifying the drive signal in accordance with second power voltage different from the first power voltage to supply a second amplified drive signal to a gate of the second power transistor.

2. The semiconductor device according to claim 1, wherein a saturated current of the first power transistor is smaller than a saturated current of the second power transistor, and
   the second power voltage is lower than the first power voltage.

3. The semiconductor device according to claim 1, wherein the first and second power voltages are supplied from individual external power sources to the first and second amplifiers, respectively.

4. The semiconductor device according to claim 1, wherein the first power voltage is supplied from an external power source to the first amplifier,
the second power voltage is lower than the first power voltage,
the gate driver further includes a power circuit generating the second power voltage from the first power voltage and supplying the generated second power voltage to the second amplifier.

5. The semiconductor device according to claim 1, wherein a half-bridge is constituted by the first and second power transistors and the gate driver.

6. The semiconductor device according to claim 5, wherein a three-phase inverter is constituted by three of the half-bridges.

7. The semiconductor device according to claim 1, wherein the first power transistor is a SiC MOSFET.

8. The semiconductor device according to claim 1, wherein
the drive signal is output by the drive circuit and received by the first amplifier and the second amplifier.

9. The semiconductor device according to claim 1, wherein
the drive signal output by the drive circuit is bifurcated into two signals that are the same and that are respectively input to the first amplifier and the second amplifier.

10. The semiconductor device according to claim 1, wherein
the drive circuit includes an input circuit receiving the input signal, and a level shift circuit level-shifting an output signal of the input circuit to generate the drive signal.

11. The semiconductor device according to claim 1, wherein
the first power voltage is supplied from a first external power source to the first amplifier and to the drive circuit, and
the second power voltage is supplied from a second external power source to the second amplifier.

12. The semiconductor device according to claim 11, wherein the second power voltage is lower than the first power voltage.

* * * * *